(12) United States Patent
Cheng et al.

(10) Patent No.: US 11,555,849 B2
(45) Date of Patent: Jan. 17, 2023

(54) DETECTION DEVICE FOR DETECTING LINE QUALITY OF ELECTRIC CIRCUIT

(71) Applicant: ZEROPLUS TECHNOLOGY CO., LTD., New Taipei (TW)

(72) Inventors: Chiu-Hao Cheng, New Taipei (TW); Tien-Yu Wu, Kaohsiung (TW)

(73) Assignee: ZEROPLUS TECHNOLOGY CO., LTD., New Taipei (TW)

(*) Notice: Subject to any disclaimer, the term of this patent is extended or adjusted under 35 U.S.C. 154(b) by 0 days.

(21) Appl. No.: 17/386,175

(22) Filed: Jul. 27, 2021

(65) Prior Publication Data

US 2022/0043053 A1  Feb. 10, 2022

(30) Foreign Application Priority Data

Aug. 6, 2020 (TW) .................................. 109126667
Jun. 24, 2021 (TW) .................................. 110123086

(51) Int. Cl.
*G01R 31/28* (2006.01)
*G01R 27/02* (2006.01)
(Continued)

(52) U.S. Cl.
CPC ................................ *G01R 31/2887* (2013.01)

(58) Field of Classification Search
CPC ........ G01R 27/02; G01R 27/16; G01R 19/00; G01R 19/165
See application file for complete search history.

(56) References Cited

U.S. PATENT DOCUMENTS 10,298,236 B2   5/2019  Tan et al.
2009/0284249 A1  11/2009  Syracuse et al.
(Continued)

FOREIGN PATENT DOCUMENTS

CN  201429682 Y  3/2010
CN  104698320 A  6/2015
(Continued)

OTHER PUBLICATIONS

Search report for TW109126667, dated Mar. 25, 2022, Total of 1 page.
English abstract for CN104698320, Total of 1 page.
English abstract for CN201429682, Total of 1 page.
English abstract for TW306626, Total of 1 page.
English abstract for TW429314, Total of 1 page.
English abstract for TW518898, Total of 1 page.
English abstract for TW201145723, Total of 1 page.
(Continued)

*Primary Examiner* — Neel D Shah
(74) *Attorney, Agent, or Firm* — Apex Juris, PLLC; Hilde Coeckx; Tracy Heims

(57) ABSTRACT

A detection device for detecting a line quality of an electric circuit includes two electrical connection members inserted into a socket and connected to two power lines, a load resistor, a switching member, a displaying module, and a control module. An end of the load resistor is connected to one of the electrical connection members, and another end thereof is connected to a first end of the switching member. A second end of the switching member is connected to the other electrical connection member. The control module controls the switching member to cut off when in a detection mode, and detects a peak voltage in a voltage waveform and records as a maximum open-circuit voltage, and controls the switching member to conduct and detects the peak voltage of the voltage waveform and records as a load voltage and calculates a load current. A line resistance value is calculated based on the maximum open-circuit voltage, the load voltage, and the load current. A message is correspondingly displayed via the displaying module.

25 Claims, 4 Drawing Sheets

(51) Int. Cl.
    *G01R 27/16*     (2006.01)
    *G01R 19/00*     (2006.01)
    *G01R 19/165*     (2006.01)

(56) References Cited

U.S. PATENT DOCUMENTS

2016/0315472 A1    10/2016  McCullough et al.
2018/0231598 A1*   8/2018  Hsu ........................ G01R 31/58

FOREIGN PATENT DOCUMENTS

| | | |
|---|---|---|
| JP | 2016167383 A | 9/2016 |
| JP | 2016170985 A | 9/2016 |
| TW | 306626 U | 5/1997 |
| TW | 429314 B | 4/2001 |
| TW | 518898 B | 1/2003 |
| TW | 201145723 A | 12/2011 |
| TW | 201925796 A | 7/2019 |

OTHER PUBLICATIONS

English abstract for TW201925796, Total of 1 page.
Office Action for JP2021129024, dated Aug. 30, 2022, total of 5 pages.

\* cited by examiner

DETECTION DEVICE FOR DETECTING LINE QUALITY OF ELECTRIC CIRCUIT

BACKGROUND OF THE INVENTION

Technical Field

The present invention relates generally to an aging detection of an electric circuit, and more particularly to a detection device for detecting a line quality of an electric circuit.

Description of Related Art

In general power wiring, an end of two power lines is connected to an AC power source, and another end thereof is connected to a socket, wherein electricity of the AC power source is conducted to the socket through the two power lines, so that when a plug of an electric device is inserted into the socket, the electricity of the AC power source is supplied to the electric device, allowing the electric device to operate.

Although the power line can conduct electricity, the power line is not an ideal conductor due to there is still a line resistance, so that when a current of the AC power source flows through the power line, the power line will generate heat due to the line resistance. The higher the resistance of the power line or the higher the current flowing through the power line, the more the heat generated by the current passing through. As a result, after the power line has been used for a certain number of years, it will heat up and cool down repeatedly, which will cause the power line to age, increasing the resistance of the power line. When the resistance of the power line increases, the heat will be generated more and accelerate the aging of the power line.

However, ordinary users cannot know an aging state of the power line, and can only determine whether to replace the power line based on a time that the power line is configurated and the usual power consumption situation. As a result, if the power line has been aging to be unusable before the replacement, a high temperature generated by the power line may ignite surrounding objects and cause fires.

Typically, a resistance of a good power line is below 1 ohm (Ω). Even if the power line is aging and unusable, the electrical impedance of the power line is only a few ohms, which cannot be accurately measured by generally electric meters. An impedance analyzer for measuring low resistance value sold on the market is not only expensive, but also hard to apply to the impedance detection of the power line at home because of its bulkiness. Therefore, how to effectively and conveniently carry out the line quality inspection of the home power circuit is a problem that needs to be solved urgently.

BRIEF SUMMARY OF THE INVENTION

In view of the above, the primary objective of the present invention is to provide a detection device for detecting a line quality of an electric circuit, which could detect the line quality of the electric circuit and be easily used and carried.

The present invention provides a detection device for detecting a line quality of an electric circuit, being adapted to be connected to a socket, wherein the socket is connected to two power lines adapted to be connected to an AC power source. The detection device includes two electrical connection members, a load resistor, a switching member, a displaying module, and a control module, wherein the electrical connection members are connected to the socket, thereby receiving an AC power via the two power lines. An end of the load resistor is electrically connected to one of the two electrical connection members. The switching member has a first end and a second end, wherein the first end is electrically connected to another end of the load resistor, and the second end is electrically connected to the other one of the two electrical connection members. The control module is electrically connected to the two ends of the load resistor, the switching member, and the displaying module for performing a detection mode, wherein in the detection mode, the control module controls the switching member to cut off and detects a peak voltage of a half-wave of a voltage waveform of the AC power and records as a maximum open-circuit voltage, and then controls the switching member to conduct and detects the peak voltage of the voltage waveform and records as a load voltage and calculates a load current flowing through the load resistor. The control module calculates a line resistance value of the socket and the two power lines based on the maximum open-circuit voltage, the load voltage, and the load current and displays a message corresponding to the line resistance value via the displaying module.

With the aforementioned design, the detection device for detecting the line quality of the electric circuit could accurately measure the line resistance of the integrated circuit of the socket and the power lines, and correspondingly provide the message on the displaying module, so that the user could know the line quality of the current integrated circuit, thereby evaluating whether the socket or the power lines need to be replaced.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
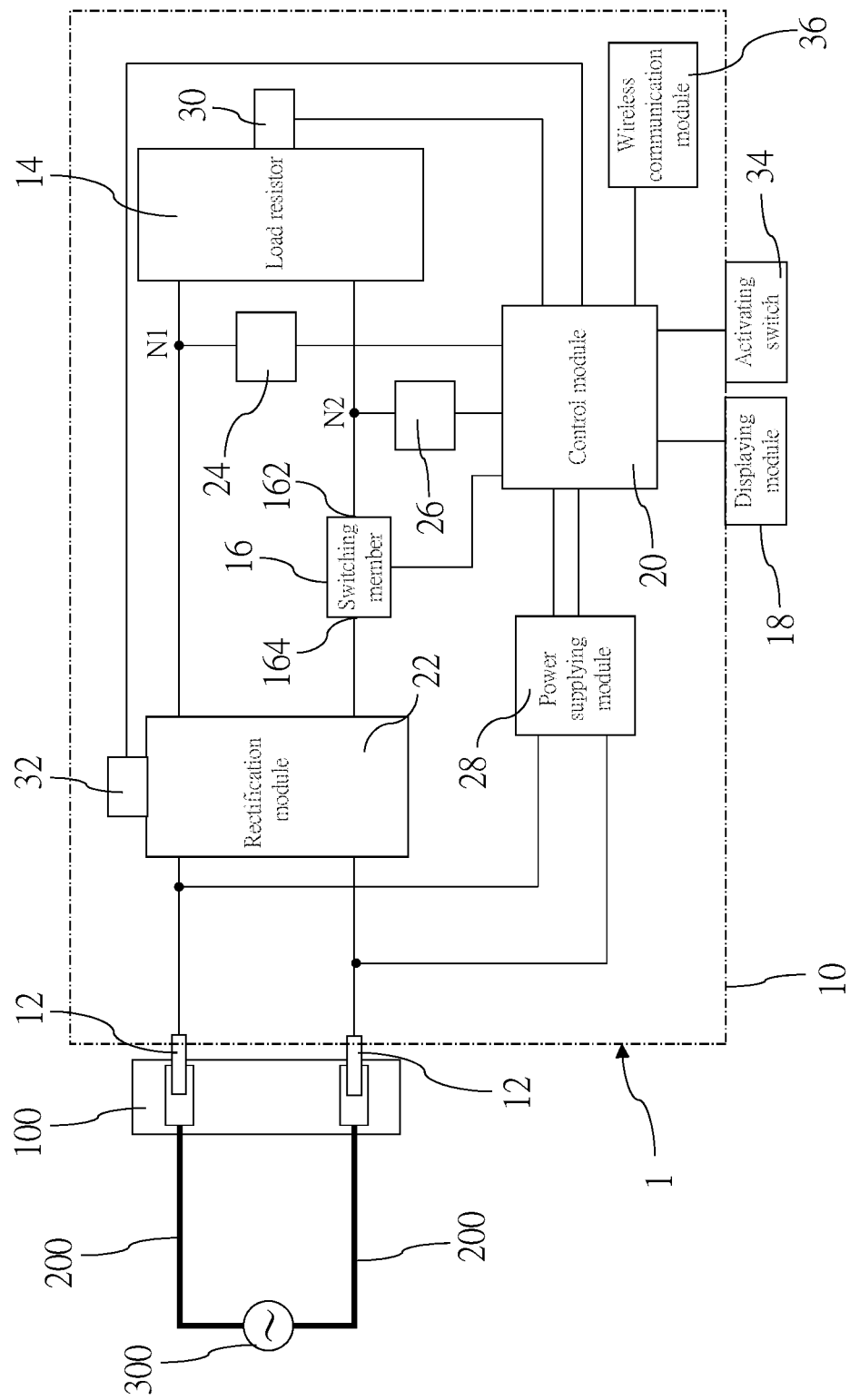
FIG. 1 is a schematic view of the detection device for detecting the line quality of the electric circuit according to a first embodiment of the present invention.

A detection device 1 for detecting a line quality of an electric circuit according to a first embodiment of the present invention is illustrated in FIG. 1 and includes a housing 10, two electrical connection members 12, a load resistor 14, a switching member 16, a switching member 16, a displaying module 18, and a control module 20, wherein the two electrical connection members 12 are disposed on the housing 10 and partially protrude out of the housing 10, and the load resistor 14, the switching member 16, and the control module 20 are disposed in the housing 10, and the displaying module 18 is disposed on the housing 10.

The two electrical connection members 12 are adapted to be inserted into a socket 100, wherein the socket 100 is electrically connected to two power lines 200. The two power lines 200 are connected to an AC power source 300, wherein an AC voltage of the AC power source 300 could be 100-240V.

The load resistor 14 has two ends, wherein one of the two ends is electrically connected to one of the two electrical connection members 12. The load resistor 14 is a power resistor, wherein a resistance value of the load resistor 14 is 10Ω as an example, preferably, the resistance value is smaller than or equal to 10 g.

In the current embodiment, the switching member 16 is a power transistor which could be a MOSFET or a BJT. In an embodiment, the switching member 16 could be a relay. The switching member 16 has a first end 162 and a second end 164 and is controllable to make the first end 162 and the second end 164 cut off or conduct, wherein the first end 162 is electrically connected to the other of the two ends of the load resistor 14, and the second end 164 is electrically connected to the other one of the two electrical connection members 12.

In the current embodiment, the detection device 1 for detecting the line quality of the electric circuit further includes a rectification module 22 which is a full-wave rectification module as an example and is electrically connected between the two electrical connection members 12 and the load resistor 14, wherein the full-wave rectification module could be, for example, a bridge rectifier. An end of the load resistor 14 is electrically connected to one of the two electrical connection members 12 via the rectification module 22, and the second end 164 of the switching member 16 is electrically connected to the other one of the two electrical connection members 12 via the rectification module 22.

The displaying module 18 is adapted to display a detection state. In the current embodiment, the displaying module 18 includes a plurality of LED members, wherein take eight LED members as an example, each of the LED members has two light colors, such as red and green.

The control module 20 is electrically connected to the two ends of the load resistor 14, the switching member 16, and the displaying module 18. More specifically, the control module 20 is a microcontroller and has at least two analog to digital converters therein. In practice, the control module 20 could be a structure that a microcontroller and an analog to digital converters are separated. The control module 20 is electrically connected to the two ends of the load resistor 14 respectively via two voltage dividing circuits 24, 26, wherein the two voltage dividing circuits 24, 26 are adapted to input voltages at the two ends of the load resistor 14 (i.e., two nodes N1, N2) to the two analog to digital converters in the control module 20 after respectively stepping down the voltages at the two ends of the load resistor 14. For example, if a divider ratio of the two voltage dividing circuits 24, 26 is set to 100:1, the divider ratio of 100:1 will be written to the control module 20 in advance, so that when the voltages received by the two analog to digital converters in the control module 20 are respectively 1.1V and 0.01V, voltages on the two N1, N2 are respectively 110V and 1V. However, the divider ratio is not limited to the example given above, the divider ratio of the two voltage dividing circuits 24, 26 could be set depending on different usage environments. The resistance value of the load resistor 14 is stored in the control module 20. A power source of the control module 20 comes from a power supplying module 28, wherein the power supplying module 28 is electrically connected to the two electrical connection members 12 to convert an AC power to a DC power required by the control module 20.

The control module 20 is adapted to perform a detection mode, wherein steps performed in the detection mode are as follows.

Figure 2:
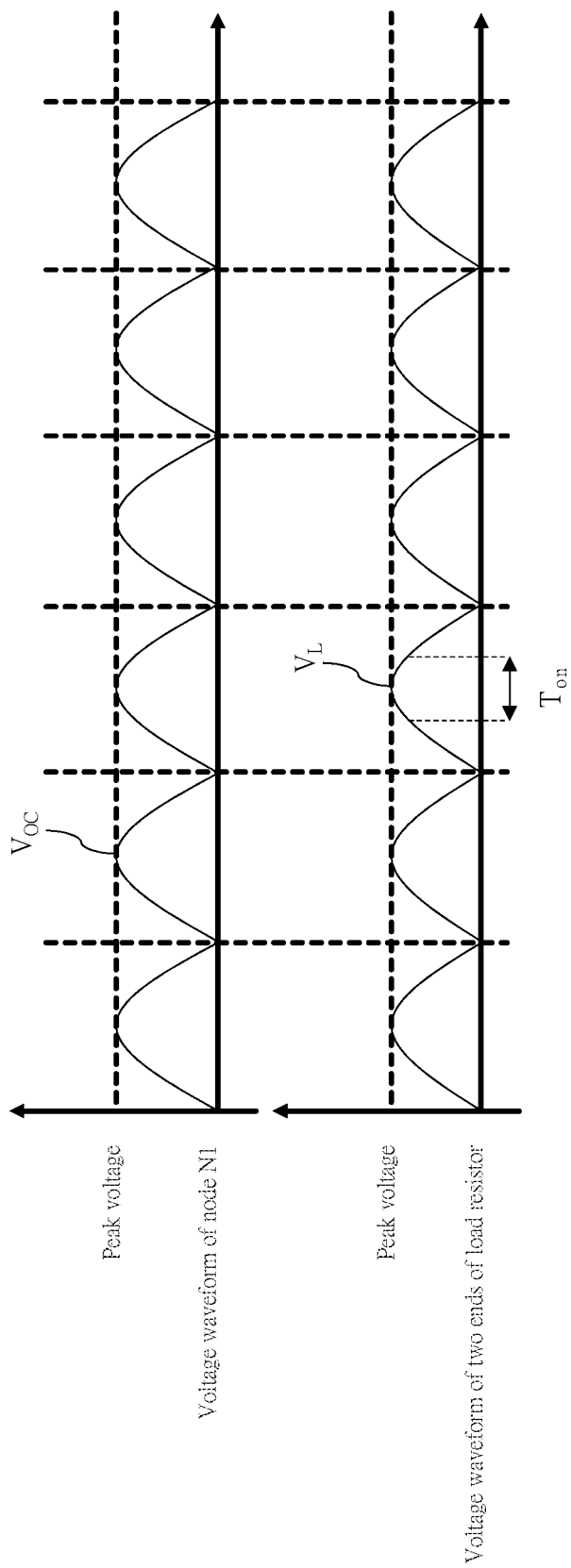
FIG. 2 is an oscillogram according to a first embodiment of the present invention.

Step 1: the control module 20 controls the switching member 16 to cut off and detects a peak voltage of a voltage waveform and records as a maximum open-circuit voltage $V_{OC}$ (as shown in FIG. 2). In the current embodiment, the control module 20 continuously obtains a variation of the voltage waveform via one of the nodes (i.e., the node N1) and detects a frequency or a cycle of the voltage waveform and records the peak voltage of the voltage waveform as the maximum open-circuit voltage $V_{OC}$. Since the divider ratio of the voltage dividing circuits 24 is known in advance, the control module 20 could calculate based on a voltage inputted into the analog to digital converters to obtain the maximum open-circuit voltage $V_{OC}$.

Step 2: the control module 20 controls the switching member 16 to conduct and detect the peak voltage of the voltage waveform and records as a load voltage $V_L$ (as shown in FIG. 2), wherein the load voltage $V_L$ is smaller than the maximum open-circuit voltage $V_{OC}$. In the current embodiment, the control module 20 controls the switching member 16 to conduct for an on-time $T_{on}$ based on the detected frequency or the detected cycle and detects the peak voltage of the voltage waveform in the on-time and records as the load voltage. When the switching member 16 is on, the control module 20 obtains the variation of the voltage waveform respectively via the nodes N1, N2. When in the peak voltage of the voltage waveform, a voltage drop (i.e., a voltage difference) between the nodes N1, N2 is the load voltage $V_L$. Since the divider ratio of the voltage dividing circuits 26 is known in advance, the control module 20 could calculate based on the voltage inputted to the analog to digital converters to obtain the load voltage $V_L$.

Preferably, in step 2, a time point that the control module 20 controls the switching member 16 to conduct is in a half-wave cycle after the peak voltage of the voltage waveform is detected in step 1, and the on-time $T_{on}$ is preferably less than or equal to a half-wave cycle of the voltage waveform. In other words, the load voltage $V_L$ could be obtained at the peak voltage in a next half-wave after obtaining the maximum open-circuit voltage $V_{OC}$, thereby speeding up the detection. With the on-time $T_{on}$ no more than a half-wave cycle of the voltage waveform, a temperature of the load resistor 14 could be prevented from being too high. In an embodiment, the time point that the control module 20 controls the switching member 16 to conduct could be at 0.8 times the peak voltage of the voltage waveform.

Step 3: since the resistance value of the load resistor 14 is known in advance, the control module 20 could calculate a load current flowing through the load resistor 14, wherein the load current is equal to the load voltage $V_L$ divided by the resistance value of the load resistor 14. Then the control module 20 calculates a line resistance value of the socket 100 and the two power lines 200 based on the maximum open-circuit voltage $V_{OC}$, the load voltage $V_L$, and the load current, wherein a formula that the line resistance value is calculated is as follow.

$$r = (VOC - VL)/IL.$$

wherein r is the line resistance value; $V_{OC}$ is the maximum open-circuit voltage; $V_L$ is the load voltage; $I_L$ is the load current.

Step 4: the control module 20 displays a message corresponding to the line resistance value via the displaying module 18. In the current embodiment, the control module 20 compares the line resistance value with a plurality of resistance value ranges which is preset, thereby determining one of the resistance value ranges to which the line resistance value belongs and displaying the message corresponding to the resistance value range that the line resistance value belongs on the displaying module 18. For example, as shown in Table 1 below, the control module 20 correspondingly controls the number and the color of the LED members to light up to form the message based on a level that the line resistance value belongs, wherein a first level and a second level represent abnormal, a third level to a fifth level represent normal but it is recommended to check, and a sixth level to an eighth level represent well.

TABLE 1

| level | first level | second level | third level | fourth level |
|---|---|---|---|---|
| resistance value ranges (Ω) | r > 1.75 | 1.5 < r ≤ 1.75 | 1.25 < r ≤ 1.5 | 1 < r ≤ 1.25 |
| displaying module | the first LED member lights up red | the first to second LED members light up red | the first to the third LED members light up orange | the first to the fourth LED members light up orange |
| level | fifth level | sixth level | seventh level | eighth level |
| resistance value ranges (Ω) | 0.75 < r ≤ 1 | 0.5 < r ≤ 0.75 | 0.25 ≤ r ≤ 0.5 | r < 0.25 |
| displaying module | the first to the fifth LED members light up orange | the first to the sixth LED members light up green | the first to the seventh LED members light up green | the first to the eighth LED members light up green |

In an embodiment, the displaying module 18 could be a display panel. The control module 20 could display the detection state via the display panel. For instance, displaying the line resistance value and the maximum open-circuit voltage $V_{OC}$, and correspondingly displaying text or image corresponding to one of the resistance value ranges, thereby forming the message for reminder, so that the user could know the quality of the power lines, for example, the displayed text could be "good", "normal", "abnormal".

Additionally, in the current embodiment, the detection device 1 for detecting the line quality of the electric circuit further includes two temperature sensors 30, 32 electrically connected to the control module 20, wherein one of the temperature sensors 30 detects a temperature of the load resistor 14, and the other one of the temperature sensors 32 detects a temperature of the rectification module 22. During a process of the detection mode, the control module 20 controls the switching member 16 to cut off when either the temperature of the load resistor 14 or the temperature of the rectification module 22 is greater than a predetermined temperature, thereby stopping detecting the load voltage $V_L$ and the line resistance value, wherein the predetermined temperature could be set above 50-60 degrees. Moreover, since the resistance value of the load resistor 14 may slightly change due to temperature changes, the control module 20 could use the measured temperature to fine-tune the resistance value of the load resistor 14 stored therein after the temperature sensors 30 detects and obtains the temperature of the load resistor 14, thereby correcting the load current flowing through the load resistor 14 which makes the calculation of the line resistance value more accurate.

Furthermore, in the current embodiment, when the control module 20 is in the detection mode, whether a voltage and a frequency of the AC power are in a normal voltage value range (90 volts-250 volts) and a normal frequency value range (47 Hz-63 Hz) is detected first, wherein if the voltage and the frequency of the AC power are respectively in the normal voltage value range and the normal frequency value range, the subsequent detection and calculation of the line resistance value is then performed; if either the voltage of the AC power is out of the normal voltage value range or the frequency of the AC power is out of the normal frequency value range, stopping detection and calculation of the line resistance value and displaying a message corresponding to voltage abnormal or frequency abnormal on the displaying module (e.g. the first to eighth LEDs light up in red or orange and flash).

In the current embodiment, the detection mode could be performed once after electric power is turned on; then, the control module 20 automatically performs the detection mode every predetermined time (such as 30 days). Alternatively, the detection device 1 for detecting the line quality of the electric circuit could further include a manual activating switch 34 electrically connected to the control module 20, wherein when a user presses the manual activating switch 34 to activate the manual activating switch 34, the control module 20 performs the detection mode. Before performing the detection mode, if the temperature of one of the temperature sensors is greater than the predetermined temperature, the detection mode is not performed.

In an embodiment, the detection device 1 for detecting the line quality of the electric circuit could include a wireless communication module 36 electrically connected to the control module 20, wherein the control module 20 could communicate with an external electronic device via the wireless communication module 36 and send a line message to the external electronic device via the wireless communication module 36. The line message at least includes the line resistance value, but could include the maximum open-circuit voltage and one of the resistance value range that the line resistance value belongs to.

Figure 3:
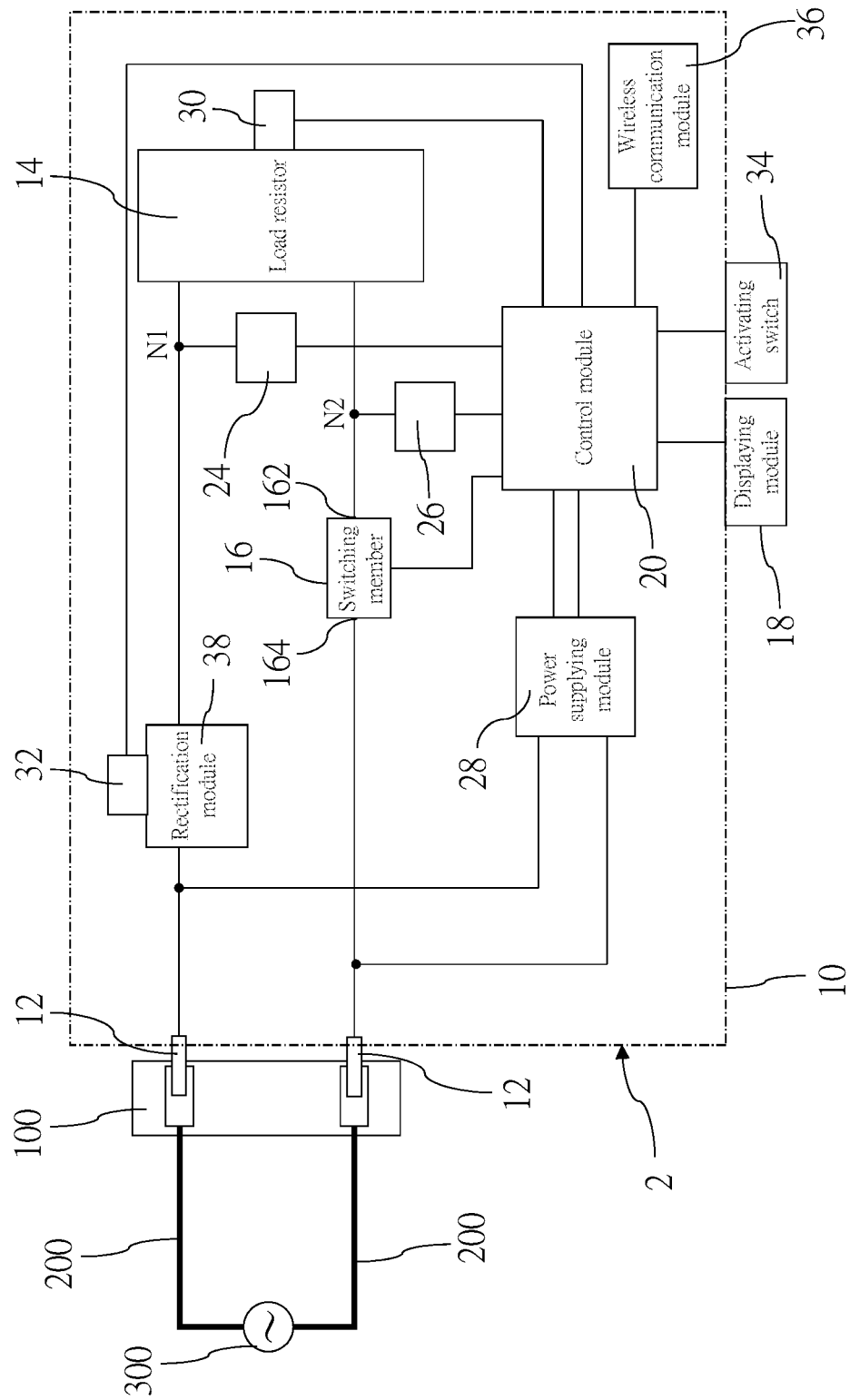
FIG. 3 is a schematic view of the detection device for detecting the line quality of the electric circuit according to a second embodiment of the present invention.

A detection device 2 for detecting a line quality of an electric circuit according to a second embodiment of the present invention is illustrated in FIG. 3, which has almost the same structures as that of the first embodiment, except that a rectification module 38 is a half-wave rectification module and is electrically connected between one of the electrical connection members 12 and the load resistor 14, wherein the half-wave rectification module could be, for example, a rectifier diode. An end of the load resistor 14 is electrically connected to one of the two electrical connection members 12 via the rectification module 38, and the second end 164 of the switching member 16 is directly and electrically connected to the other one of the two electrical connection members 12.

Figure 4:
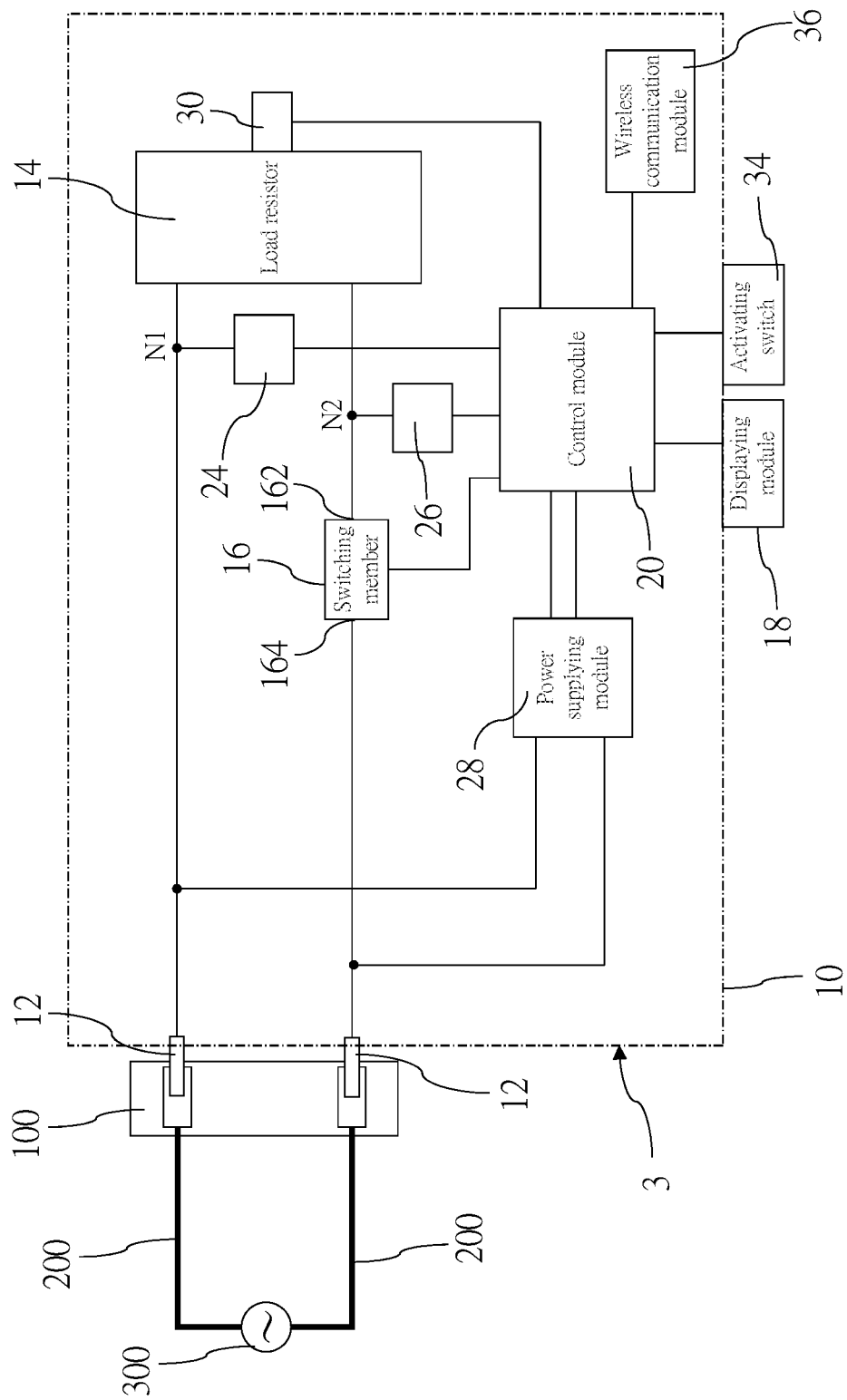
FIG. 4 is a schematic view of the detection device for detecting the line quality of the electric circuit according to a third embodiment of the present invention.

A detection device 3 for detecting a line quality of an electric circuit according to a third embodiment of the present invention is illustrated in FIG. 4, which has almost the same structures as that of the first embodiment, except that the rectification module 22 is omitted, wherein an end of the load resistor 14 is electrically connected to one of the two electrical connection members 12, and the second end 164 of the switching member 16 is directly and electrically connected to the other one of the two electrical connection members 12. In the current embodiment, the control module 20 could detect the variation of the voltage waveform as well. Preferably, take a positive half-wave of the peak voltage as the maximum open-circuit voltage $V_{OC}$ or the load voltage $V_L$.

With the aforementioned design, the detection device for detecting the line quality of the electric circuit of the present invention could not only accurately measure the line resistance of an integrated circuit of socket and power lines, but also provide the corresponding message. Additionally, the detection device has a small volume and is easy to carry. By simply plugging the detection device into the socket, the line resistance of the integrated circuit corresponding to the socket could be detected, so that the user could easily and quickly know the quality of the current power lines.

It must be pointed out that the embodiments described above are only some preferred embodiments of the present invention. All equivalent structures which employ the concepts disclosed in this specification and the appended claims should fall within the scope of the present invention.

What is claimed is:

1. A detection device for detecting a line quality of an electric circuit, being adapted to be connected to a socket, wherein the socket is connected to two power lines adapted to be connected to an AC power source; the detection device comprising:
   two electrical connection members respectively adapted to be connected to the socket, thereby receiving an AC power via the two power lines;
   a load resistor, wherein an end of the load resistor is electrically connected to one of the two electrical connection members; the load resistor is a power resistor;
   a switching member having a first end and a second end, wherein the first end is electrically connected to another end of the load resistor, and the second end is electrically connected to the other one of the two electrical connection members;
   a displaying module; and
   a control module electrically connected to the two ends of the load resistor, the switching member, and the displaying module for performing a detection mode, wherein in the detection mode, the control module controls the switching member to cut off and detects a peak voltage of a half-wave of a voltage waveform of the AC power and records as a maximum open-circuit voltage, and then controls the switching member to conduct and detects the peak voltage of the voltage waveform and records as a load voltage and calculates a load current flowing through the load resistor; the control module calculates a line resistance value of the socket and the two power lines based on the maximum open-circuit voltage, the load voltage, and the load current and displays a message corresponding to the line resistance value via the displaying module;
   wherein the control module detects a frequency or a cycle of the voltage waveform when the switching member is cut off, and controls the switching member to conduct for an on-time based on the detected frequency or the detected cycle after obtaining the maximum open-circuit voltage, and detects the peak voltage of the voltage waveform in the on-time and records as the load voltage.

2. The detection device as claimed in claim 1, further comprising a rectification module electrically connected between one of the two electrical connection members and the load resistor, wherein the rectification module converts the AC power of the AC power source to a DC power; an end of the load resistor is electrically connected to one of the two electrical connection members via the rectification module.

3. The detection device as claimed in claim 2, wherein the rectification module is a full-wave rectification module.

4. The detection device as claimed in claim 2, wherein the rectification module is a half-wave rectification module.

5. The detection device as claimed in claim 1, wherein when the switching member is cut off, the control module controls the switching member to conduct in a half-wave cycle after the peak voltage of the voltage waveform is detected.

6. The detection device as claimed in claim 1, wherein the on-time is no more than a half-wave cycle of the voltage waveform.

7. The detection device as claimed in claim 1, further comprising a temperature sensor electrically connected to the control module, wherein the temperature sensor detects a temperature of the load resistor; the control module controls the switching member to cut off when the temperature of the load resistor is greater than a predetermined temperature.

8. The detection device as claimed in claim 2, further comprising a temperature sensor electrically connected to the control module, wherein the temperature sensor detects a temperature of the rectification module; the control module controls the switching member to cut off when the temperature of the rectification module is greater than a predetermined temperature.

9. The detection device as claimed in claim 1, further comprising a manual activating switch electrically connected to the control module, wherein the control module performs the detection mode after the manual activating switch activates.

10. The detection device as claimed in claim 1, wherein the control module performs the detection mode every a predetermined time.

11. The detection device as claimed in claim 1, wherein the control module compares the line resistance value and a plurality of resistance value ranges to determine one of the resistance value ranges that the line resistance value belongs, and displays the message on the displaying module based on one of the resistance value ranges that the line resistance value belongs.

12. The detection device as claimed in claim 1, further comprising a wireless communication module electrically connected to the control module, wherein the control module sends a line message via the wireless communication module; the line message comprises the line resistance value.

13. The detection device as claimed in claim 1, further comprising a temperature sensor electrically connected to the control module, wherein the temperature sensor detects a temperature of the load resistor; a resistance value of the load resistor is stored in the control module; the control module adjusts the resistance value of the load resistor based on the temperature detected by the temperature sensor, and calculates the load current flowing through the load resistor based on the resistance value of the load resistor being adjusted.

14. The detection device as claimed in claim 1, wherein the control module first detects whether a voltage of the AC power is in a normal voltage value range when in the detection mode; if the voltage of the AC power is in the normal voltage value range, the control module detects and calculates the line resistance value; otherwise, stopping detecting and calculating the line resistance value, and displaying a message corresponding to voltage abnormal via the displaying module; the normal voltage value range ranges between 90V and 250V.

15. The detection device as claimed in claim 1, wherein the control module first detects whether a frequency of the AC power is in a normal frequency value range when in the detection mode; if the frequency of the AC power is in the normal frequency value range, the control module detects and calculates the line resistance value; otherwise, stopping detecting and calculating the line resistance value, and displaying a message corresponding to frequency abnormal via the displaying module; the normal frequency value range ranges between 47 Hz and 63 Hz.

16. A detection device for detecting a line quality of an electric circuit, being adapted to be connected to a socket, wherein the socket is connected to two power lines adapted to be connected to an AC power source; the detection device comprising:
two electrical connection members respectively adapted to be connected to the socket, thereby receiving an AC power via the two power lines;
a load resistor, wherein an end of the load resistor is electrically connected to one of the two electrical connection members; the load resistor is a power resistor;
a switching member having a first end and a second end, wherein the first end is electrically connected to another end of the load resistor, and the second end is electrically connected to the other one of the two electrical connection members;
a displaying module;
a control module electrically connected to the two ends of the load resistor, the switching member, and the displaying module for performing a detection mode, wherein in the detection mode, the control module controls the switching member to cut off and detects a peak voltage of a half-wave of a voltage waveform of the AC power and records as a maximum open-circuit voltage, and then controls the switching member to conduct and detects the peak voltage of the voltage waveform and records as a load voltage and calculates a load current flowing through the load resistor; the control module calculates a line resistance value of the socket and the two power lines based on the maximum open-circuit voltage, the load voltage, and the load current and displays a message corresponding to the line resistance value via the displaying module; and
a temperature sensor electrically connected to the control module, wherein the temperature sensor detects a temperature of the load resistor; the control module controls the switching member to cut off when the temperature of the load resistor is greater than a predetermined temperature.

17. The detection device as claimed in claim 16, wherein a resistance value of the load resistor is stored in the control module; the control module adjusts the resistance value of the load resistor based on the temperature detected by the temperature sensor, and calculates the load current flowing through the load resistor based on the resistance value of the load resistor being adjusted.

18. The detection device as claimed in claim 16, wherein the control module first detects whether a frequency of the AC power is in a normal frequency value range when in the detection mode; if the frequency of the AC power is in the normal frequency value range, the control module detects and calculates the line resistance value; otherwise, stopping detecting and calculating the line resistance value, and displaying a message corresponding to frequency abnormal via the displaying module; the normal frequency value range ranges between 47 Hz and 63 Hz.

19. The detection device as claimed in claim 16, further comprising a rectification module electrically connected between one of the two electrical connection members and the load resistor, wherein the rectification module converts the AC power of the AC power source to a DC power; an end of the load resistor is electrically connected to one of the two electrical connection members via the rectification module.

20. The detection device as claimed in claim 16, further comprising a manual activating switch electrically connected to the control module, wherein the control module performs the detection mode after the manual activating switch activates.

21. The detection device as claimed in claim 16, wherein the control module performs the detection mode every a predetermined time.

22. The detection device as claimed in claim 16, wherein the control module compares the line resistance value and a plurality of resistance value ranges to determine one of the resistance value ranges that the line resistance value belongs, and displays the message on the displaying module based on one of the resistance value ranges that the line resistance value belongs.

23. The detection device as claimed in claim 16, further comprising a wireless communication module electrically connected to the control module, wherein the control module sends a line message via the wireless communication module; the line message comprises the line resistance value.

24. The detection device as claimed in claim 16, wherein the control module detects a frequency or a cycle of the voltage waveform when the switching member is cut off, and controls the switching member to conduct for an on-time based on the detected frequency or the detected cycle after obtaining the maximum open-circuit voltage, and detects the peak voltage of the voltage waveform in the on-time and records as the load voltage; wherein when the switching member is cut off, the control module controls the switching member to conduct in a half-wave cycle after the peak voltage of the voltage waveform is detected.

25. The detection device as claimed in claim 16, wherein the control module first detects whether a voltage of the AC power is in a normal voltage value range when in the detection mode; if the voltage of the AC power is in the normal voltage value range, the control module detects and calculates the line resistance value; otherwise, stopping detecting and calculating the line resistance value, and displaying a message corresponding to voltage abnormal via the displaying module; the normal voltage value range ranges between 90V and 250V.

* * * * *